(12) United States Patent
Felici et al.

(10) Patent No.: US 6,515,496 B2
(45) Date of Patent: Feb. 4, 2003

(54) MICROSTRUCTURE TESTING HEAD

(75) Inventors: Stefano Felici, Merate (IT); Giuseppe Crippa, Merate (IT)

(73) Assignee: Technoprobe S.r.l., Cernusco Lombardone (IT)

( * ) Notice: Subject to any disclaimer, the term of this patent is extended or adjusted under 35 U.S.C. 154(b) by 0 days.

(21) Appl. No.: 09/853,884

(22) Filed: May 10, 2001

(65) Prior Publication Data
US 2002/0024347 A1 Feb. 28, 2002

(30) Foreign Application Priority Data
May 11, 2000 (IT) .......................... MI00A1045

(51) Int. Cl.[7] .............................................. G01R 31/02
(52) U.S. Cl. .................... 324/754; 324/158.1; 324/761; 439/482; 439/66
(58) Field of Search .............................. 324/158.1, 754, 324/761, 763, 72.5, 758, 765; 439/482, 66

(56) References Cited
U.S. PATENT DOCUMENTS

| 4,686,467 | A | * | 8/1987 | DeLapp et al. ............. 324/72.5 |
| 4,774,462 | A | * | 9/1988 | Black ....................... 324/158.1 |
| 5,320,559 | A | * | 6/1994 | Uratsuji et al. ............. 439/482 |
| 5,952,843 | A | * | 9/1999 | Vinh ......................... 324/761 |
| 6,043,671 | A | * | 3/2000 | Mizuta ....................... 324/765 |
| 6,242,320 | B1 | * | 5/2001 | Haseyama et al. .......... 324/754 |
| 6,242,929 | B1 | * | 6/2001 | Mizuta ....................... 324/765 |

* cited by examiner

Primary Examiner—Michael Sherry
Assistant Examiner—Jimmy Nguyen
(74) Attorney, Agent, or Firm—Marger Johnson & McCollom, P.C.

(57) ABSTRACT

A testing head for microstructures is presented. The testing head includes a top guide plate and bottom guide plate, separated by an air gap. Each of the plates include respective guide holes for accommodating a contact probe having a contact tip that is arranged to mechanically and electrically contact a contact pads on a device under test. The contacting tip of the testing head has a non-zero pitch angle ($\alpha_{OUT}$) relative to the contact pad, and "scrubs" the pad as the device under test is drawn against the contacting tip, causing the contact probe to bend within the air gap.

35 Claims, 4 Drawing Sheets

MICROSTRUCTURE TESTING HEAD

TECHNICAL FIELD

The present invention relates to a testing head for microstructures, and, more particularly, the invention relates to a testing head for use on semiconductor integrated devices, and a method of making the microstructure testing heads.

BACKGROUND OF THE INVENTION

A testing head is essentially a device adapted to electrically interconnect a number of contact pads of a microstructure with corresponding paths of a measuring machine employed to carry out the testing.

The circuit testing procedure is used to detect any faulty integrated circuits directly at the manufacturing stage of the circuits. Testing heads are generally employed to electrically test the integrated circuits on the wafer itself before the circuits are separated and inserted into a chip package.

A testing head comprises one or more pairs of parallel guide plates placed a given distance apart (to leave an air space therebetween), and a set of special movable contact elements. The pair of guide plates consists of a top guide plate and a bottom guide plate, both of which are formed with guide holes for the movable contact elements to be passed therethrough. The individual contact elements are typically small wires made of special alloys with good electrical and mechanical properties. These contact elements will be referred to as "probes" or "contact probes" through the remainder of this specification, to highlight the function that they serve.

A good contact between the probes and the contact pads of a device under test is achieved by keeping the testing head pressed against the device, with the probes bending or flexing in the air gap between the guide plates. Testing heads of this type are commonly known as "vertical probes".

The amount of bending undergone by the probes, and the force required to produce the bending, is related to a number of factors, including the physical characteristics of the alloy used to make the probes, and an amount of offset between the guide holes in the top plate and the corresponding guide holes in the bottom plate, as well as other factors.

Excessive bending of the probes should be avoided, however, because a probe may be flexed too much and not return to its original shape, or may otherwise become stuck in the guide holes.

It should be noted that, for the testing head to perform satisfactorily, the probes must be allowed an amount of axial play in the guide holes. Thus, if a single probe breaks, the broken probe can be removed and replaced, without the need to replace the entire testing head.

These factors should be taken into account when manufacturing the testing head, because a good electric connection between the probes and the device under test is mandatory.

In some cases, the contact probes are affixed to the top guide plate of the testing head in a permanent manner. This is known as a clamped probe testing head. However, testing heads with loose-mounted probes are more frequently used, where the probes are electrically connected to a "board" by a microcontact interface called the "space transformer". This is known as a loose probe testing head.

In the latter case, each contact probe has a second contacting tip opposite the one used to contact the device under test. This second contacting tip is aimed at one of the contact pads on the space transformer. A good electric contact is established between the probes and the space transformer in a similar way as the contact to the device being tested, i.e., by pressing the probes against the contact pads on the space transformer.

One advantage of a loose probe testing head is that one or more faulty probes, or the whole set of probes, can be replaced with greater ease than if clamped probe testing heads are used.

However, the top and bottom guide plates must be designed to hold the contact probes in place, even when no device is abutting their contacting tips for testing, or when the whole set of probes is moved during a replacement operation.

SUMMARY OF THE INVENTION

Embodiments of the invention provide a testing head for microstructures that makes firm electric contact with a device under test, holds the probes securely in their guides, and minimizes the likelihood of bent probes becoming stuck in their guides.

Presented is a device that has contact probes whose contacting tips meet the contact pads under a non-zero pitch angle and scrub their surfaces the moment a device to be tested is drawn against the contacting tips, thereby causing the contact probes to bend within an air gap. Additionally presented is a method of creating an electro/mechanical connection between a microstructure testing head and a device to be tested.

The features and advantages of a testing head according to the invention will be apparent from the following description of embodiments thereof, given by way of non-limiting examples with reference to the accompanying drawings.

DETAILED DESCRIPTION OF THE PREFERRED EMBODIMENTS

Figure 1:
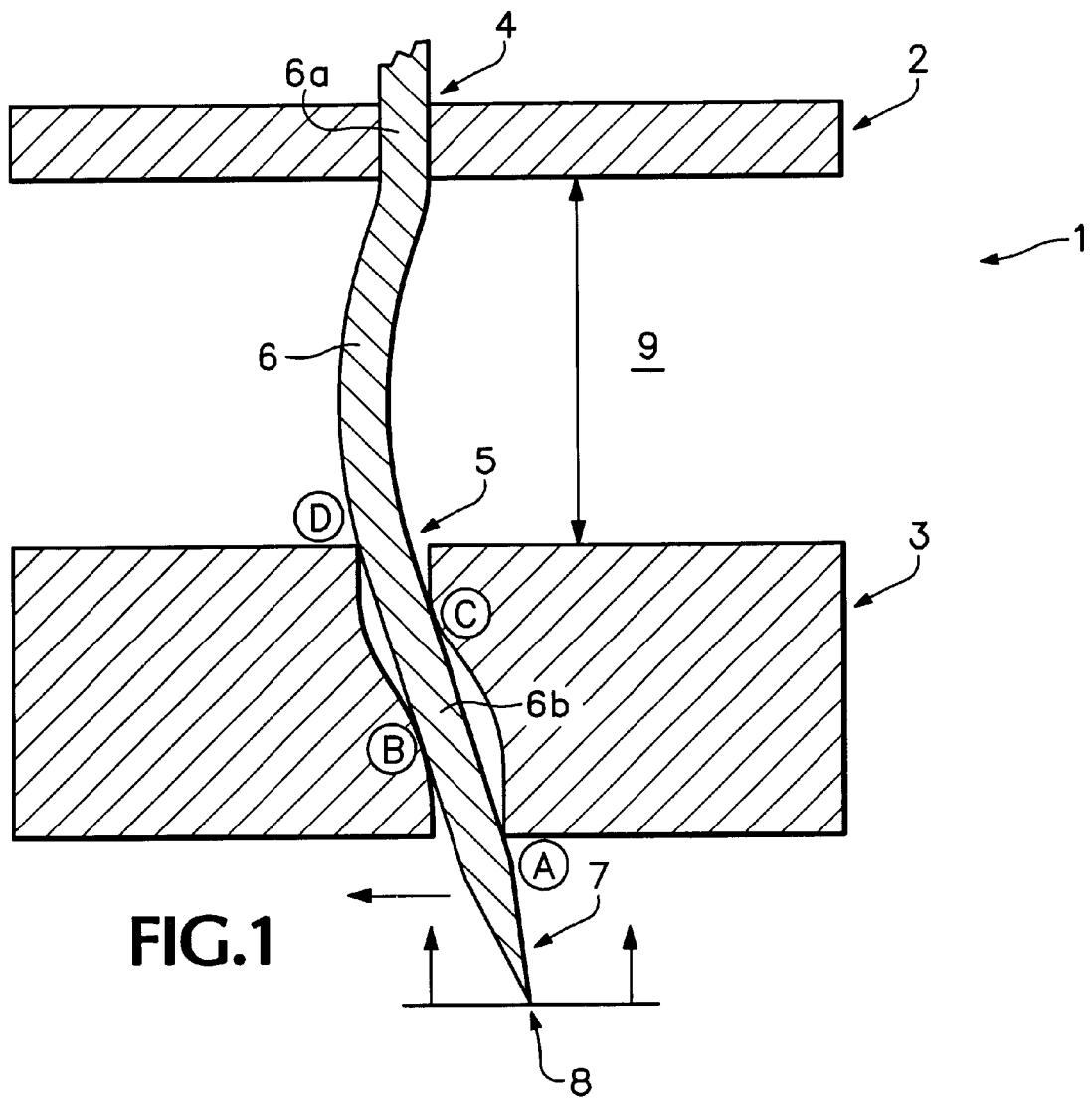
FIG. 1 is a cross-sectional view of a testing head according to an embodiment of the invention.

With reference to FIG. 1, a testing head 1 according to an embodiment of the invention is shown. The testing head 1 includes a top guide plate 2 and a bottom guide plate 3. A top guide hole 4 is formed in the top guide plate 2, and a bottom guide hole 5 is formed in the bottom guide plate 3. Although for clarity only one set of guide holes 4, 5 and one contact probe 6 is shown, typically a testing head includes several contact probes, for example between 10 and 3000. The invention is equally applicable to testing heads having any number of contact probes.

A contact probe 6 passes through the top guide hole 4 and the bottom guide hole 5. The contact probe 6 has a first section 6a near the top guide hole 4, a second section 6b near the bottom guide hole 5, and at least one contacting end or tip 7. The tip 7 of the contact probe 6 is used to contact the device being tested. The other end of the contact probe is coupled to the testing device, in order to read signals from the device being tested through the contact probe, as will be discussed below. In operation of the testing head 1, the contacting tip 7 is brought to touch a contact pad 8 on a device under test, thus establishing a mechanical and electrical connection between the device and a testing apparatus (not shown). The testing head 1 represents the working end of the testing apparatus.

When the contact tip 7 of the probe 6 properly touches the device, enough force is placed on the probe to cause it to flex or bend in an area of the probe located between the first section 6a and the second section 6b. Providing enough pressure to the probe 6 to cause it to bend ensures that a good mechanical and electrical connection is made between the tip 7 and the contact pad 8.

The top and bottom guide plates, 2 and 3, are suitably separated by an air gap 9 to accommodate the bent portions of the contact probes 6. The top and bottom guide holes, 4 and 5, are adequately sized to receive the contact probes 6.

Advantageously, the contacting tip 7 of a contact probe 6 is set to meet the contact pad 8 at a pitch angle $\alpha_{OUT}$. This pitch angle $\alpha_{OUT}$ causes the contacting tip 7 to "scrub" the contact pad 8 as pressure is applied to the probe 6, so as to improve the electric contact established between the tip 7 and the pad 8. Even if, for example, the pad 8 is soiled, oxidized, or otherwise inhibiting good electrical contact.

Of course, the contacting tip pitch angle $\alpha_{OUT}$ between the probe tip 7 and the contact pad 8 should be determined for optimum scrubbing effect and minimum resistance of the tip-to-pad contact, as well as to avoid the risk of the tip 7 skidding off of the contact pad area and possibly causing damage to the device under test or to the testing head 1 itself.

To provide a testing head 1 with contact probes 6 pitched at a suitable angle $\alpha_{OUT}$ to the contact pad 8, different embodiments of the invention use a number of variations in the top and bottom guide plates of the testing head. For convenience of explanation, the same reference numerals will be used through the remainder of this description to designate substantially similar elements in the various embodiments of the invention. By way of example, the terms "horizontal" and "vertical" will be used in relation to the drawings, although complementary or other arrangements are possible.

In a first embodiment, the testing head 1 has at least one guide plate formed with a crooked guide hole that is effective to deform the contact probe 6 and set the contacting tip 7 at a predetermined pitch angle $\alpha_{OUT}$. This arrangement will be hereinafter referred to as "constant scrub angle" because the contacting tip 7 is always held at a constant angle relative to the device being tested.

In a preferred embodiment of the invention shown in FIG. 1, the bottom guide plate 3 has an S-like shaped crooked bottom guide hole 5. The S-like shaped pattern is effective to set the contact probe 6 into a predetermined position by frictional engagement at a plurality of support points A, B, C and D on the interior of the bottom guide hole 5.

Embodiments of the invention can also include a top guide hole 4 in the testing head 1 that holds the probe 6 at an angle somewhat slanted from vertical. This arrangement can facilitate a smoother bending of the probe 6 than if the probe 6 is held perpendicular relative to the top guide plate 2. Preferably, the angle of the guide hole 4 through the top guide plate 2 may be offset from perpendicular between about 0 to 10°, but may be any angle that facilitates the proper bending of the probe 6. In some instances the best perpendicular offset angle may need to be determined by trial and error. The probe 6 may be attached to the guide plate 2 in a firmly held or a sliding fit.

Alternatively, the top guide plate 2 could be formed with an S-like shaped crooked top guide hole 4, and not the bottom guide hole 5, or both the top and bottom guide plates 2, 3 could be formed with S-like shaped crooked guide holes 4, 5. Furthermore, differently shaped crooked guide holes could be provided, such as curvilinear holes, still providing a number of points of support. As used in this description, "crooked" is meant to describe any form of guide hole that is non-straight, including those holes with one bend, such as a "C" shape, two bends, such as an "S" shape, or any number of bends, such as a "stairstep" profile, as well as others. Additionally, the guide holes 4, 5 in the guide plates 2, 3, may have smooth shaped bends (referred to herein as "curvelinear", no matter how many bends the hole includes), such as that shown in FIG. 1, or they could be rather abrupt, such as those possible to be made by having a guide plate formed by multiple layers, shown in FIG. 10 and discussed below.

The mechanical aspect of the operation of a constant scrub angle type of the testing head 1, having top 2 and bottom 3 guide plates formed with crooked guide holes, is as described herein below.

Figure 2:
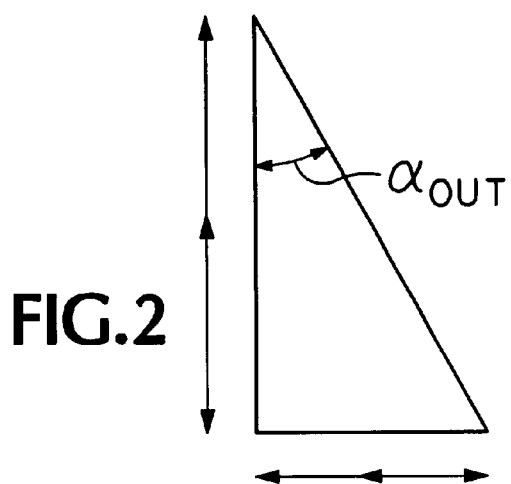
FIG. 2 is a diagram illustrating mechanical aspects of the operation of the testing head of FIG. 1.

A device under test properly drawn against the testing head 1 will produce "overtraver" of the contact probe 6 in the air gap 9, meaning that downward force is applied to the top of the contact probe 6 while keeping the device steady, or upward force is applied to the bottom tip 7 of the contact probe 6 by the device under test while keeping the top guide plate 2 steady, in excess of that merely necessary to make an initial contact between the contact pad 8 and the probe tip 7. This overtravel will cause the probe 6 to bend. But the support points A, B, C and D bind the movement of the contacting tip 7 to a constant pitch angle $\alpha_{OUT}$ to the contact pad 8. Thus, an upward movement or overtravel of the contact probe 6 is accompanied by a horizontal or scrubbing movement of the contacting tip 7, over the contact pad 8, with the pitch angle $\alpha_{OUT}$ being held constant, as shown schematically in FIG. 2. In other words, a desired scrubbing action can be achieved by suitably adjusting the pitch angle $\alpha_{OUT}$ and the amount of overtravel of the contacting tip 7.

In another modification, the testing head 1 has at least one guide plate 2, 3 formed with non-vertical guide holes 4, 5 that deflects the contact probe 6 within the air gap 9 and shifts the other guide plate in the horizontal direction in order to force a bend in the contact probe 6 and set its contacting tip 7 at a predetermined pitch angle $\alpha_{OUT}$. This arrangement will be referred to as "variable scrub angle" hereinafter, because the angle at which the contacting tip meets the contact pad 8 will change as the contact probe 6 flexes in the air gap 9.

Figure 3:
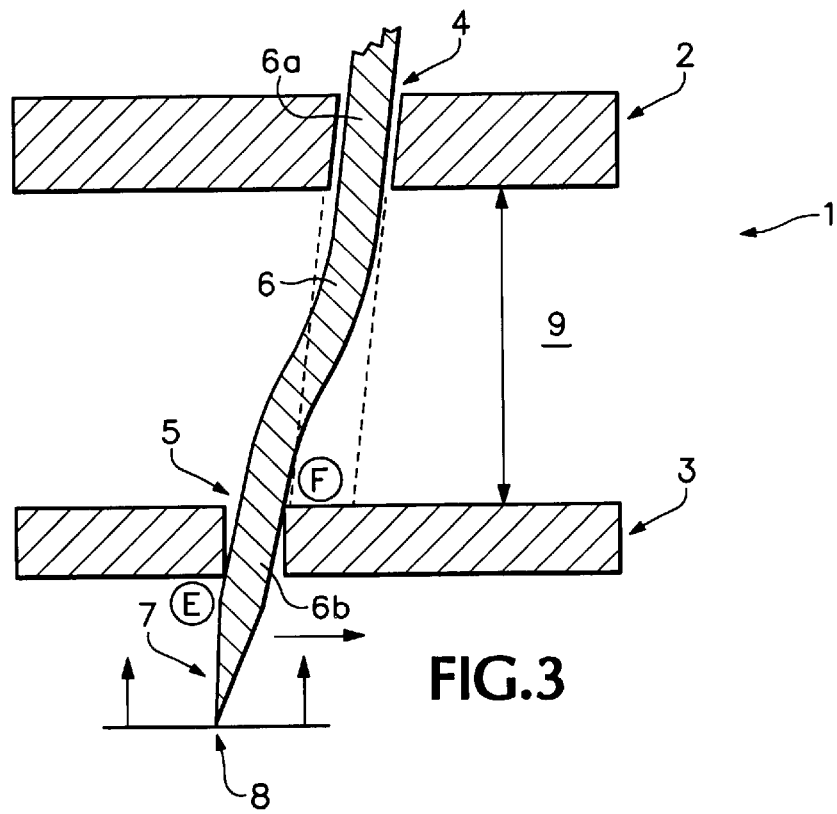
FIG. 3 is a cross-sectional view of a testing head according to a second embodiment of the invention.

In an embodiment of the invention shown in FIG. 3, the top guide plate 2 has a straight non-vertical top guide hole 4, and the bottom guide hole 5 in the bottom guide plate 3 does not have the same angle deflection. Additionally, the guide holes 4 and 5 may be horizontally shifted relative to one another, for example, between 1 um and 4 mm, and, more preferably, between 1 um and 1.5 mm. This arrangement forces a bend in the contact probe 6 and pitches its contacting tip 7 at an angle $\alpha_{OUT}$ relative to the contact pad 8. The contact probe 6 has at least two support points E, F in the bottom guide hole 5, as shown in FIG. 3. The probe 6 can either be a sliding fit or held firmly in the top guide hole 4. Having the top guide hole 4 lie non-perpendicular to the top guide plate 2 encourages the contact probe 6 to bend, and keeps the bent section of the probe 6 constrained within the air gap 9.

The mechanical aspects of the operation of a variable scrub angle type testing head 1, having a top guide plate 2 formed with non-vertical holes and a bottom guide plate 3 adapted to be shifted relative to the top guide plate 2 in the horizontal direction, is as described herein below.

Figure 4A:
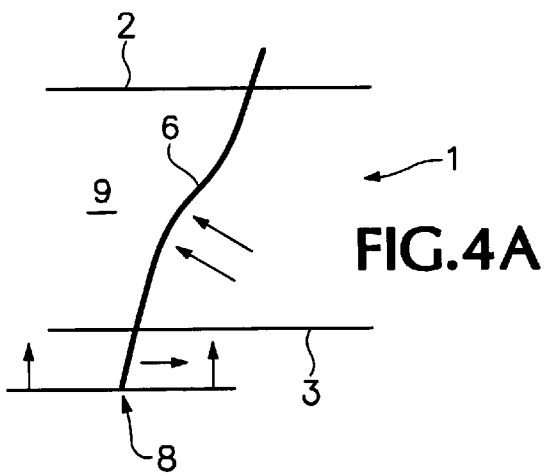
FIGS. 4A and 4B are a diagrams illustrating mechanical aspects of the operation of the testing head of FIG. 3.
Figure 4B:
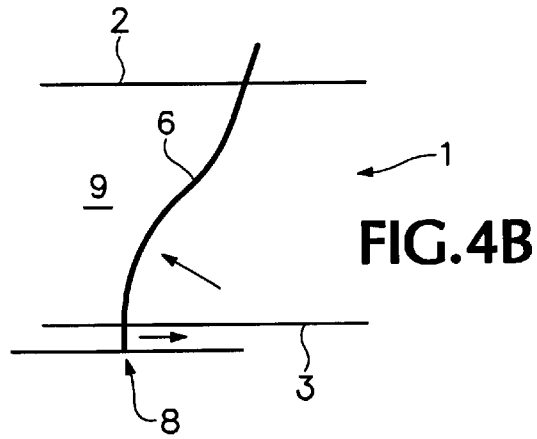

A device under test, drawn against the testing head 1, produces "overtravel" of the contact probe 6 in the air gap 9, so that the probe is bent. This is similar to the constant scrub angle type testing head 1, described above. In this case, where the testing head 1 has a variable scrub angle, however, the movement of the contacting tip 7 of the probe 6 is not required to maintain a constant pitch angle $\alpha_{OUT}$ relative to the contact pad 8. The tip 7 moves progressively into a vertically upright position over the pad 8, and in so doing, the tip 7 scrubs the pad 8 as shown in FIGS. 4A and 4B. Once the bending force of the probe 6 is released (for instance by removing the device under test), the probe 6 can drop smoothly through the bottom guide hole 5 into its initial position.

In particular, as shown in FIG. 4A, the contact pad 8 of the device under test is brought in contact with the probe 6. As the probe 6 flexes as indicated in FIG. 4A, the friction arrangement of the support points E and F in the bottom guide hole 5 also causes the probe tip 7 to scrape the contact pad 8, as the probe 6 continues to flex into the shape as shown in FIG. 4B. The ending position of the probe 6, because the probe is nearly vertically aligned in the bottom hole 5, effectively prevents the probe 6 from becoming stuck in the bottom guide hole 5.

Figure 5:
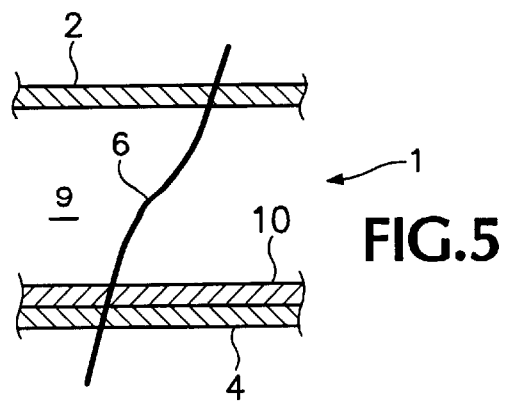
FIG. 5 is a cross-sectional detailed view of a testing head according an embodiment of the invention.

In a further modification of the guide plates, which is useful with both of the above arrangements, a film 10 of an elastic material is provided, as shown in FIG. 5, on either the top or bottom guide plates, or both, to hold the probes more positively inside their corresponding top and bottom guide holes, yet still maintaining a sliding fit arrangement.

In addition, the elastic material film 10 contributes to prevent the probe from sticking in the guide holes by virtue of the elastic bias that it applies to the probes as these are bent against the film. In particular, the elastic bias from the film facilitates the probe 6 retraction from the holes 4 or 5 as the bending force is removed.

Figure 6:
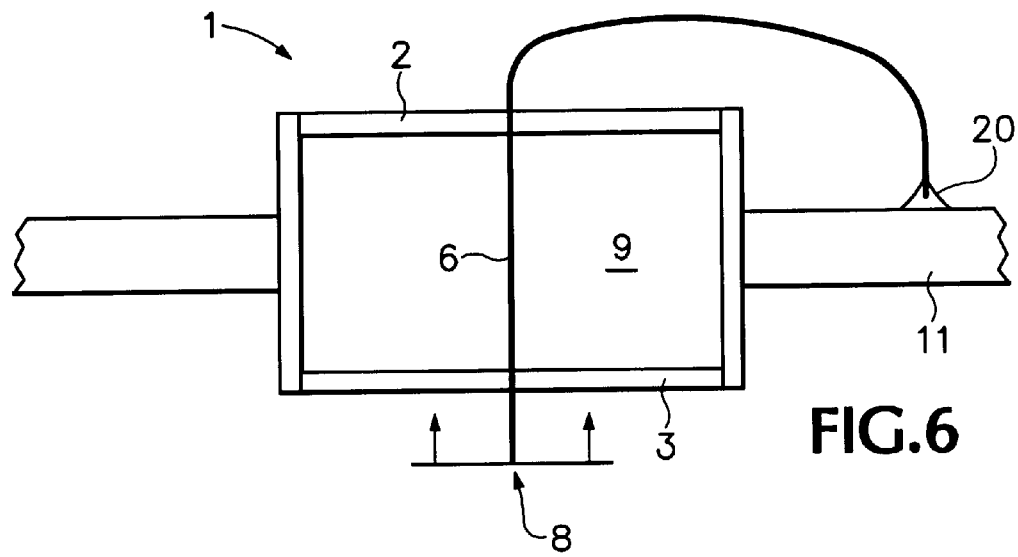
FIG. 6 is a diagram of a clamped-probe testing head.

As discussed previously, the contact probes 6 may be fixedly mounted on the testing head 1. For that purpose, the top guide plate 2 would securely hold a plurality of long wires in the top guide holes 4, e.g. bonded therein with a resin, or some other suitable material. The long wires continue through the top guide holes 4 and are conventionally soldered at a bond 20 to a board 11 of the testing head 1, as shown in FIG. 6. This arrangement forms a clamped probe testing head.

Figure 7:
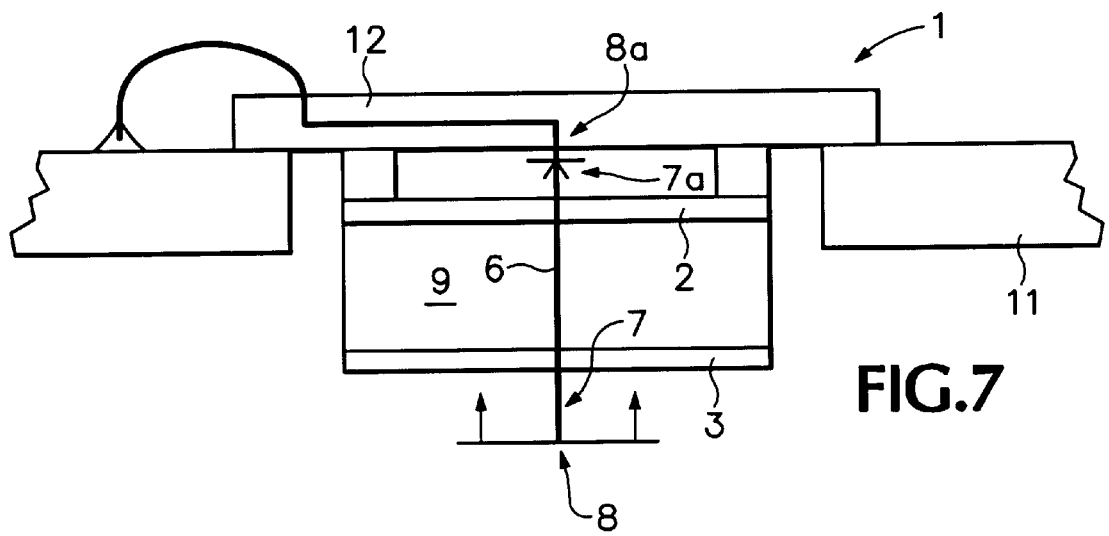
FIGS. 7 and 8 are diagrams of loose-probe testing heads.
Figure 8:
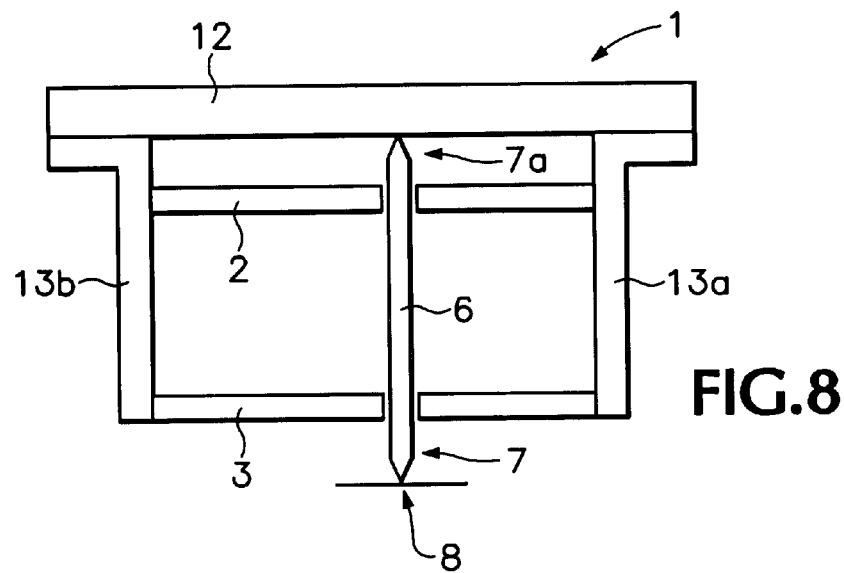

It should be noted that the foregoing arrangements could be used with loose-mounted probes as well, for example, as shown in FIG. 7. In that Figure, a microcontact interface 12, known as a "space transformer," is itself electrically connected to the board 11. In this case, the contact probes 6 are attached neither to the bottom guide plate 3 nor to the top plate 2, and would be formed with additional contacting tips 7a aimed at a plurality of contact pads 8a on the space transformer 12. The electric contact of the probes with the space transformer may be established in the same way as the contact to the device under test, by urging the probes 6 onto the contact pads 8a of the space transformer, the latter being held away from the device under test by side spacers 13a and 13b, as shown in FIG. 8. In particular, the contact pads 8a on the space transformer 12 are aligned with micrometric accuracy to the contacting tips 7A that jut out from the top guide plate 2. This yields a loose probe type testing head.

Figure 9:
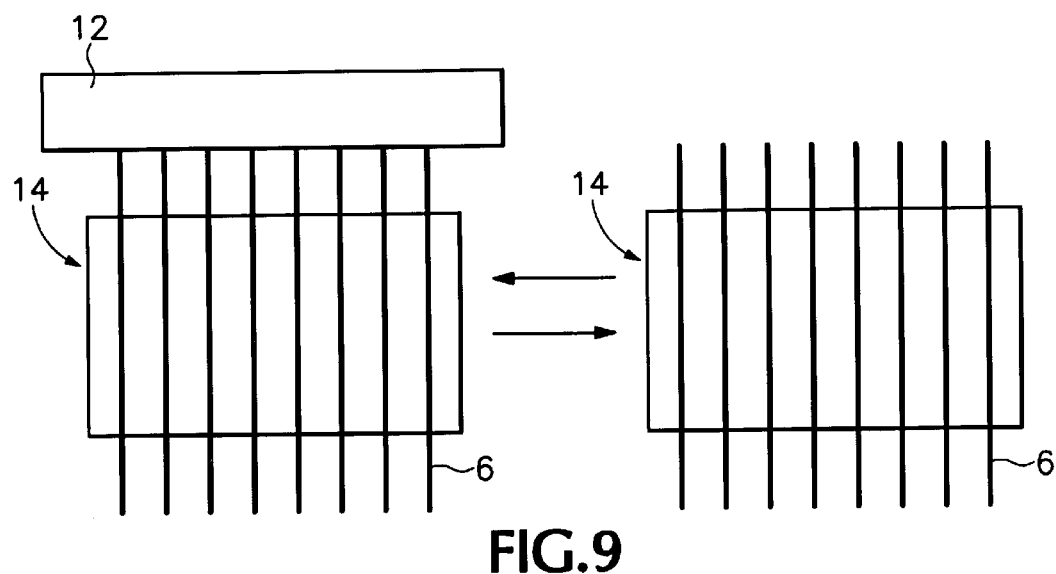
FIG. 9 is a diagram illustrating a replacement operation in a testing head like that shown in FIGS. 7 and 8.

The testing head 1 with loose-mounted contact probes 6 allows the set of probes 6, sometimes referred to as a probe block 14, to be easily replaced. As shown in FIG. 9, one or more faulty probes 6 within the probe block 14 can be easily replaced, with no need for replacing soldered joints as would be required if the clamped probe testing head 1 of FIG. 6 were instead used.

In particular, with respect to FIG. 9, the contact probes 6 in a probe block 14 may slide within their top 2 and bottom 3 guide plates, but not completely out of the plates, on the occasion of a faulty contact probe 6 or the whole probe block 14 being replaced, or when no device is abutting the testing head 1 for testing purposes.

Advantageously, either of the previously discussed arrangements, i.e. the constant scrub angle or the variable scrub angle arrangements, could be applied to a testing head 1 with loose mounted contact probes 6. In this case, in addition to an improved electric contact between the probes 6 and the device under test from the scrubbing action of the contacting tips 7, a frictional resistance is created between the guides 4, 5 and the probes 6, effective to stop the contact probes 6 from slipping out while the probes 6 or the probe block 14 are being replaced, or when no device is abutted against the testing head 1 for testing.

Accordingly, guide plates formed with crooked guide holes, in particular holes having an S-like pattern, can be used, and the guide plates be suitably offset in the horizontal direction to force a deformation in the contact probe, thereby ensuring that the probe will stay in place even while probes or probe blocks are being replaced, or no device is abutting the head for testing.

This effect can also be achieved using a film of an elastic material 10, to be applied preferably on the inner face of the top guide plate. With the elastic material 10 so applied, the film is formed with contact probe clearance holes having a smaller diameter than the corresponding guide holes, so that the probes 6 will be retained within the guide holes 4, 5 by the slight frictional drag created between the film 10 and the probes.

Figure 10:
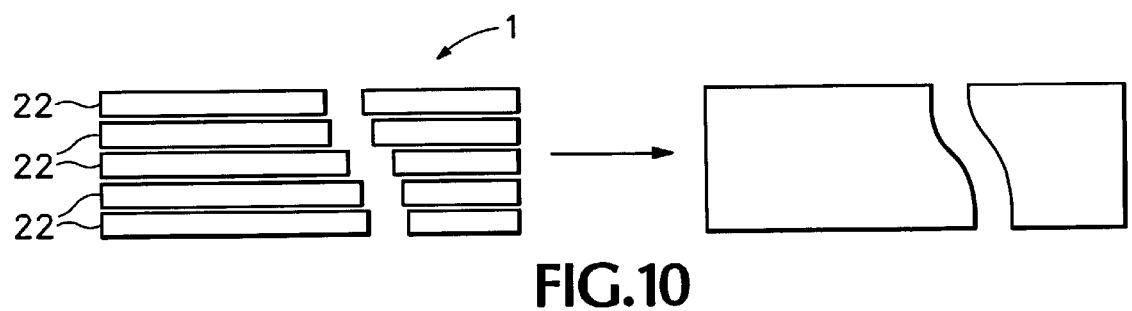
FIG. 10 is a cross-sectional view of a guide for a testing head according to an embodiment of the invention.

A further embodiment of a portion of this invention is shown in FIG. 10. Guide plates having crooked guide holes could be implemented in the form of stacks of thinner guide plates 22, laid in mutual contact to define a guide hole having a desired pattern, as shown schematically in FIG. 10.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A testing head for microstructures comprising:
    a top guide plate having a top guide hole formed therethrough;

a bottom guide plate having a bottom guide hole formed therethrough, the bottom guide plate separated from the top guide plate by an air gap; and a contact probe having a contacting tip arranged to mechanically and electrically contact a contact pad of a test device as the test device is drawn against the contacting tip, wherein at least one of the guide holes in the guide plates is formed with a crooked shape that is structured to force the contact probe to bend in the air gap, and structured to force the contacting tip of the contact probe to the pitch angle ($\alpha_{OUT}$) that is non-perpendicular relative to the contact pad of the test device.

2. The microstructure testing head of claim 1, wherein the at least one guide hole is structured to hold the contact probe firmly in a predetermined position by friction between the contact probe and a plurality of support points in the at least one guide hole.

3. The microstructure testing head of claim 2, wherein the at least one guide hole has a curvilinear pattern.

4. The microstructure testing head of claim 3, wherein the at least one guide hole is S-shaped.

5. The microstructure testing head according to claim 2, wherein the guide plate containing the at least one crooked shape guide hole is formed of a plurality layers of material, and wherein edges of the plurality of layers of material form the plurality of support points.

6. The microstructure testing head of claim 1, wherein the top guide hole and the bottom guide hole are horizontally shifted relative to each other.

7. The microstructure testing head of claim 6 wherein the top guide hole and the bottom guide hole are horizontally shifted relative to each other between about 1 micrometer and 3 millimeters.

8. The microstructure testing head of claim 7 wherein the at least one of the guide holes is S shaped.

9. The microstructure testing head of claim 7 wherein exactly one of the guide holes is crooked, and wherein the other of the guide holes is relatively straight, and formed non-perpendicular to its respective guide plate.

10. The microstructure testing head of claim 1, further comprising:
a plurality of top guide holes in the top guide plate,
a plurality of bottom guide holes in the bottom guide plate; and
a plurality of contact probes each insertable through a respective one of the top guide holes and one of the bottom guide holes.

11. The microstructure testing head according to claim 1, further comprising a film of an elastic material applied to one or both of the guide plates.

12. The microstructure testing head according to claim 1, wherein one or both of the guide plates are formed of a plurality of layers of material.

13. A testing head for microstructures, comprising:
a top guide plate having a top guide hole formed therethrough;
a bottom guide plate having a bottom guide hole formed therethrough, the bottom guide plate separated from the top guide plate by a gap; and
a contact probe protruding through the top guide hole and the bottom guide hole and having a contacting tip;
wherein at least one of the guide holes in the guide plates is formed with a crooked shape, and as a contact pad of a test device is placed against the contacting tip of the contact probe, the at least one crooked shape guide hole causes the contacting tip to meet the contact pad at a non-perpendicular pitch angle relative to the contact pad, and causes the contacting tip to scratch a surface of the contact pad, and wherein the at least one crooked shape guide hole causes the contact probe to bend as the test device is further pressed against the contacting tip of the contact probe.

14. The testing head of claim 13 wherein the testing head is structured to hold the contacting tip of the contact probe at a constant angle as the test device is further pressed against the contacting tip of the contact probe.

15. The testing head of claim 14 wherein the at least one crooked shape guide hole causes the contact probe to be frictionally held within the at least one crooked shape guide hole in the non-perpendicular pitch angle relative to the contact pad.

16. The testing head of claim 15 wherein the contact probe is frictionally held at a plurality of support points in the at least one crooked shape guide hole.

17. The testing head of claim 15 wherein the at least one crooked shape guide hole has a curvilinear shape.

18. The testing head of claim 17 wherein the at least one crooked shape guide hole has an S-shape.

19. The testing head of claim 13 wherein the testing head is structured to allow the contacting tip of the contact probe to change the non-perpendicular pitch angle relative to the contact pad as the test device is further pressed against the contacting tip of the contact probe.

20. The testing head of claim 19 wherein the top guide hole and the bottom guide hole are horizontally shifted relative to one another.

21. The testing head of claim 19 wherein the top guide hole and the bottom guide hole are horizontally shifted relative to one another between about 1 micrometer and 4 millimeters.

22. The testing head of claim 13 wherein exactly one of the guide holes has a crooked shape and wherein the other guide hole is formed non-perpendicular to its respective guide plate.

23. The testing head of claim 13, further comprising:
a plurality of top guide holes in the top guide plate,
a plurality of bottom guide holes in the bottom guide plate; and
a plurality of contact probes each insertable through a respective one of the top guide holes and one of the bottom guide holes.

24. The testing head of claim 13, further comprising a film of an elastic material applied to one or both of the guide plates.

25. The testing head of claim 13 wherein one or both of the guide plates are formed by a plurality of layers of material.

26. The testing head according to claim 13, wherein the guide plate containing the at least one guide hole is formed of a plurality layers of material, and wherein edges of the plurality of layers of material form the plurality of support points.

27. A method for creating an electro/mechanical connection between a microstructure testing head and a device to be tested, the method comprising:
holding a contacting tip of a contact probe in the testing head at an angle non-perpendicular to a contact pad on the device to be tested, prior to a time when the contact pad touches the contacting tip, by holding a portion of the contact probe in a frictional relationship with a plurality of support points located in a crooked guide hole in a guide plate;

causing the contacting tip of the contact probe to scrape against the contact pad as the device to be tested is pressed against the contacting tip; and causing the contact probe to bend as the device to be tested is further pressed against the contacting tip.

28. The method of claim 27 wherein the crooked guide hole is curvilinear.

29. The method of claim 28 wherein the curvilinear guide hole is S-shaped.

30. The method of claim 27 wherein the guide plate is formed from a plurality of layers of material.

31. The method of claim 20 wherein the plurality of support points are made from edges of the plurality of layers of material.

32. The method of claim 27, further comprising:

while the device to be tested is pressed against the contacting tip and the contacting tip is scraping against the contact pad, allowing the contacting tip of the contact probe to change the angle of the contacting tip that was originally non-perpendicular to the contact pad.

33. The method of claim 32, further comprising, before the contact pad touches the contacting tip:

inserting the contact probe through a top guide hole in a top guide plate and a bottom guide hole in a bottom guide plate wherein the top guide hole and the bottom guide hole are not vertically aligned with one another.

34. The method of claim 33, wherein at least one of the top guide hole and the bottom guide hole is not perpendicular relative to its respective guide plate.

35. The method of claim 33, further comprising applying a layer of elastic material to at least one of the top and bottom guide plates.

* * * * *

UNITED STATES PATENT AND TRADEMARK OFFICE
CERTIFICATE OF CORRECTION

PATENT NO. : 6,515,496 B2  
DATED : February 4, 2003  
INVENTOR(S) : Felici et al.

It is certified that error appears in the above-identified patent and that said Letters Patent is hereby corrected as shown below:

Title page,  
Item [56], References Cited, U.S. PATENT DOCUMENTS, "6,242,320 B1   5/2001   Haseyama et al.   324/754" should read -- 6,229,320 B1  5/2001   Haseyama et al.  324/754 --; and "6,242,929B1   6/2001  Mizuta   324/765" should read -- 6,242,929B1  6/2001   Mizuta   324/754 --.

Column 4,  
Line 33, "produce "overtraver" of" should read -- produce "overtravel" of --.

Column 9,  
Line 12, "The method of claim 20" should read -- The method of claim 30 --.

Signed and Sealed this

Second Day of March, 2004

JON W. DUDAS  
*Acting Director of the United States Patent and Trademark Office*